United States Patent
Clark et al.

(10) Patent No.: US 9,105,471 B2
(45) Date of Patent: Aug. 11, 2015

(54) RARE EARTH OXY-NITRIDE BUFFERED III-N ON SILICON

(75) Inventors: Andrew Clark, Los Altos, CA (US);
Erdem Arkun, San Carlos, CA (US);
Robin Smith, Palo Alto, CA (US);
Michael Lebby, Apache Junction, AZ (US)

(73) Assignee: TRANSLUCENT, INC., Palo Alto, CA (US)

( * ) Notice: Subject to any disclaimer, the term of this patent is extended or adjusted under 35 U.S.C. 154(b) by 241 days.

(21) Appl. No.: 13/196,919

(22) Filed: Aug. 3, 2011

(65) Prior Publication Data
US 2013/0032858 A1 Feb. 7, 2013

(51) Int. Cl.
*H01L 21/02* (2006.01)
*H01L 29/20* (2006.01)

(52) U.S. Cl.
CPC ...... *H01L 21/0254* (2013.01); *H01L 21/02381* (2013.01); *H01L 21/02439* (2013.01); *H01L 21/02488* (2013.01); *H01L 21/02505* (2013.01); *H01L 29/2003* (2013.01)

(58) Field of Classification Search
CPC ............ H01L 21/02304; H01L 21/02389; H01L 21/02403; H01L 21/02472; H01L 21/0254; H01L 29/2003; H01L 21/02439; H01L 21/02458; H01L 21/02469; H01L 21/02488; H01L 21/02505

USPC ............... 257/43, 76, 190, 191, 615
See application file for complete search history.

(56) References Cited

U.S. PATENT DOCUMENTS

| | | | |
|---|---|---|---|
| 7,011,706 B2 * | 3/2006 | Higuchi et al. | 117/89 |
| 8,455,756 B2 * | 6/2013 | Lebby et al. | 136/261 |
| 2009/0183774 A1 * | 7/2009 | Atanackovic | 136/261 |
| 2009/0236595 A1 * | 9/2009 | Atanackovic | 257/43 |

\* cited by examiner

*Primary Examiner* — Jay C Kim
(74) *Attorney, Agent, or Firm* — Robert A. Parsons; Michael W. Goltry; Parsons & Goltry

(57) ABSTRACT

Rare earth oxy-nitride buffered III-N on silicon includes a silicon substrate with a rare earth oxide (REO) structure, including several REO layers, is deposited on the silicon substrate. A layer of single crystal rare earth oxy-nitride is deposited on the REO structure. The REO structure is stress engineered to approximately crystal lattice match the layer of rare earth oxy-nitride so as to provide a predetermined amount of stress in the layer of rare earth oxy-nitride. A III oxy-nitride structure, including several layers of single crystal rare earth oxy-nitride, is deposited on the layer of rare earth oxy-nitride. A layer of single crystal III-N nitride is deposited on the III oxy-nitride structure. The III oxy-nitride structure is chemically engineered to approximately crystal lattice match the layer of III-N nitride and to transfer the predetermined amount of stress in the layer of rare earth oxy-nitride to the layer of III-N nitride.

12 Claims, 2 Drawing Sheets

US 9,105,471 B2

RARE EARTH OXY-NITRIDE BUFFERED III-N ON SILICON

FIELD OF THE INVENTION

This invention relates in general to the deposition of III-N nitrides on silicon wafers.

BACKGROUND OF THE INVENTION

It has been found that III-N nitrides are a desirable semiconductor material in many electronic and photonic applications. As understood in the art, the III-N nitride semiconductor material must be provided as a crystalline or single crystal formation for the most efficient and useful bases for the fabrication of various electronic and photonic devices therein. Further, the single crystal III-N nitride semiconductor material is most conveniently formed on single crystal silicon wafers because of the extensive background and technology developed in the silicon semiconductor industry. However, because of the difference in spacing in the crystal lattice structure it is extremely difficult to grow III-N nitrides on silicon wafers.

It would be highly advantageous, therefore, to remedy the foregoing and other deficiencies inherent in the prior art.

Accordingly, it is an object of the present invention to provide new and improved methods of growing III-N nitrides on silicon substrates.

It is another object of the present invention to provide new and improved methods of providing large diameter, high yield epitaxial wafers of III-N nitrides on silicon.

It is another object of the present invention to provide new and improved large diameter, high yield epitaxial wafers of III-N nitrides on silicon.

SUMMARY OF THE INVENTION

Briefly, to achieve the desired objects and aspects of the instant invention in accordance with a preferred embodiment thereof, provided is a rare earth oxy-nitride buffered III-N nitride on a silicon substrate. The embodiment includes a silicon substrate with a rare earth oxide (REO) structure, including several REO layers, deposited on the silicon substrate. A layer of single crystal rare earth oxy-nitride is deposited on the REO structure. The REO structure is stress engineered to approximately crystal lattice match the layer of rare earth oxy-nitride so as to provide a predetermined amount of stress in the layer of rare earth oxy-nitride. A III oxy-nitride structure, including several layers of single crystal rare earth oxy-nitride, is deposited on the layer of rare earth oxy-nitride. A layer of single crystal III-N nitride is deposited on the III oxy-nitride structure. The III oxy-nitride structure is chemically engineered to approximately crystal lattice match the layer of III-N nitride and to transfer the predetermined amount of stress in the layer of rare earth oxy-nitride to the layer of III-N nitride, whereby deformations in the layer of III-N nitride are substantially eliminated.

The desired objects and aspects of the instant invention are further realized in accordance with a specific embodiment of rare earth oxy-nitride buffered III-N on a silicon substrate. The embodiment includes a crystalline silicon substrate with a rare earth oxide (REO) structure deposited thereon. The REO structure includes a first layer of rare earth metal oxide defined by the formula $(M1_xM2_{(1-x)})_2O_3$, where $0 \leq x \leq 1$, deposited on the substrate and a second layer of rare earth metal oxide defined by the formula $(M3_yM4_{(1-y)})_2O_3$, where $0 \leq y \leq 1$, deposited on the first layer of rare earth metal oxide, and M1, M2, M3, and M4 are rare earth metals. A layer of single crystal rare earth oxy-nitride is deposited on the rare earth oxide structure, the rare earth oxide structure being stress engineered by varying x and y to approximately crystal lattice match the layer of rare earth oxy-nitride so as to provide a predetermined amount of stress in the layer of rare earth oxy-nitride. a III oxy-nitride structure is deposited on the layer of rare earth oxy-nitride. A layer of single crystal III-N nitride is deposited on the III oxy-nitride structure. The layer of single crystal III-N nitride includes a first sub-layer defined by the formula $(III2_xIII3_{(1-x)})N$, where $0 \leq x \leq 1$, and a second sub-layer defined by the formula $(III4_yIII5_{(1-y)})N$, where $0 \leq y \leq 1$, and III2, III3, III4, and III5 are metals selected from the group III metals in the periodic table. The layer of rare earth oxy-nitride and the III oxy-nitride structure are chemically engineered to approximately crystal lattice match the layer of III-N nitride and to transfer the predetermined amount of stress in the layer of rare earth oxy-nitride to the layer of III-N nitride, whereby deformations in the layer of III-N nitride are substantially eliminated. A ratio III2/III3 of the first sub-layer and a ratio III4/III5 of the second sub-layer is varied by varying x and y, respectively, one of linearly or step wise.

The desired objects and aspects of the instant invention are further realized in accordance with a method of fabricating rare earth oxy-nitride buffered III-N on a silicon substrate including the steps of depositing a rare earth oxide structure on a silicon substrate, the step including depositing a plurality of layers of single crystal rare earth oxide in a stack on the substrate. The method further includes the step of depositing a layer of single crystal rare earth oxy-nitride on the rare earth oxide structure, the step including stress engineering the rare earth oxide structure to approximately crystal lattice match the layer of rare earth oxy-nitride to the rare earth oxide structure so as to provide a predetermined amount of stress in the layer of rare earth oxy-nitride. The method further includes the step depositing a III oxy-nitride structure on the layer of rare earth oxy-nitride, the step including depositing a plurality of layers of single crystal rare earth oxy-nitride. The method further includes the step of depositing a layer of single crystal III-N nitride on the III oxy-nitride structure and chemically engineering the III oxy-nitride structure to approximately crystal lattice match the layer of III-N nitride to the III oxy-nitride structure and to transfer the predetermined amount of stress in the layer of rare earth oxy-nitride to the layer of III-N nitride, whereby deformations in the layer of III-N nitride are substantially eliminated.

BRIEF DESCRIPTION OF THE DRAWING

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
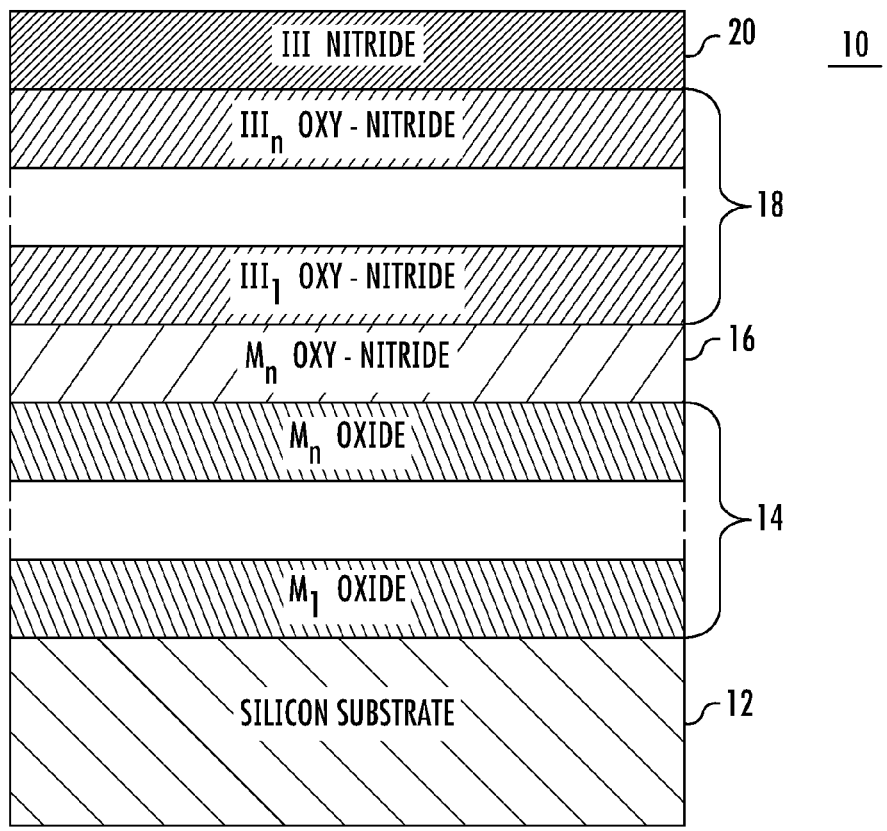
FIG. 1 is a simplified layer diagram of a stress engineered epitaxial wafer in accordance with the present invention.

Referring to FIG. 1, a simplified layer diagram is illustrated of a high yield epitaxial wafer 10 including III-N nitride on silicon in accordance with the present invention. Wafer 10 includes a single crystal silicon substrate 12 which, it will be understood, is or may be a standard well know single crystal silicon wafer or portion thereof generally known and used in the semiconductor industry. Single crystal silicon substrate 12, it will be understood, is not limited to any specific crystal orientation but could include <111> silicon, <110> silicon, <100> silicon or any other orientation or variation known and used in the art.

A rare earth oxide structure 14 is grown directly on the surface of substrate 12 using any of the well known growth methods, such as MBE, MOCVD, PLD (pulsed laser deposition), sputtering, ALD (atomic layer deposition), or any other known growth method for thin films. Further, the growth method used will generally be used for all additional layers and may conveniently be employed to grow the entire structure in a continuous process sometimes referred to herein as performed within a one wafer single epitaxial process. Rare earth oxide structure 14 may be considered a plurality of single crystal or crystalline layers or a single layer of single crystal or crystalline material with a plurality of sub-layers, either of which will be referred to herein for convenience of understanding as a "plurality of layers". Further, rare earth oxide structure 14 may vary from the bottom to the top (as described in more detail below) and/or within each layer either linearly or in a step by step process. In any case, rare earth oxide structure 14 is positioned between the surface of substrate 12 and the lower surface of a single crystal layer of rare earth oxy-nitride 16. Throughout this disclosure whenever rare earth materials are mentioned it will be understood that "rare earth" materials are generally defined as any of the lanthanides as well as scandium and yttrium.

Rare earth oxide structure 14 is specifically designed or engineered to gradually adjust from the crystal lattice of substrate 12 to approximately the crystal lattice of rare earth oxy-nitride layer 16, also designated $M_n$ oxy-nitride. This gradual adjustment of the crystal lattice between the interface with substrate 12 and the interface with layer 16 is generally designed to closely or approximately match the lattice spacing between adjacent layers or to provide a predetermined amount of stress or mismatch in lattice spacing. For example, layer 16 can be unstressed or stressed, either compressive or tensile, depending on the selection or engineering of the rare earth composition in structure 14. That is, structure 14 is selected or engineered such that it constrains the overgrown rare earth oxy-nitride layer 16 to a predetermined stress state, either unstressed, or compressive, or tensile. The gradual adjustment of the crystal lattice spacing performed in the growth of structure 14 is defined herein as stress engineering.

Figure 3:
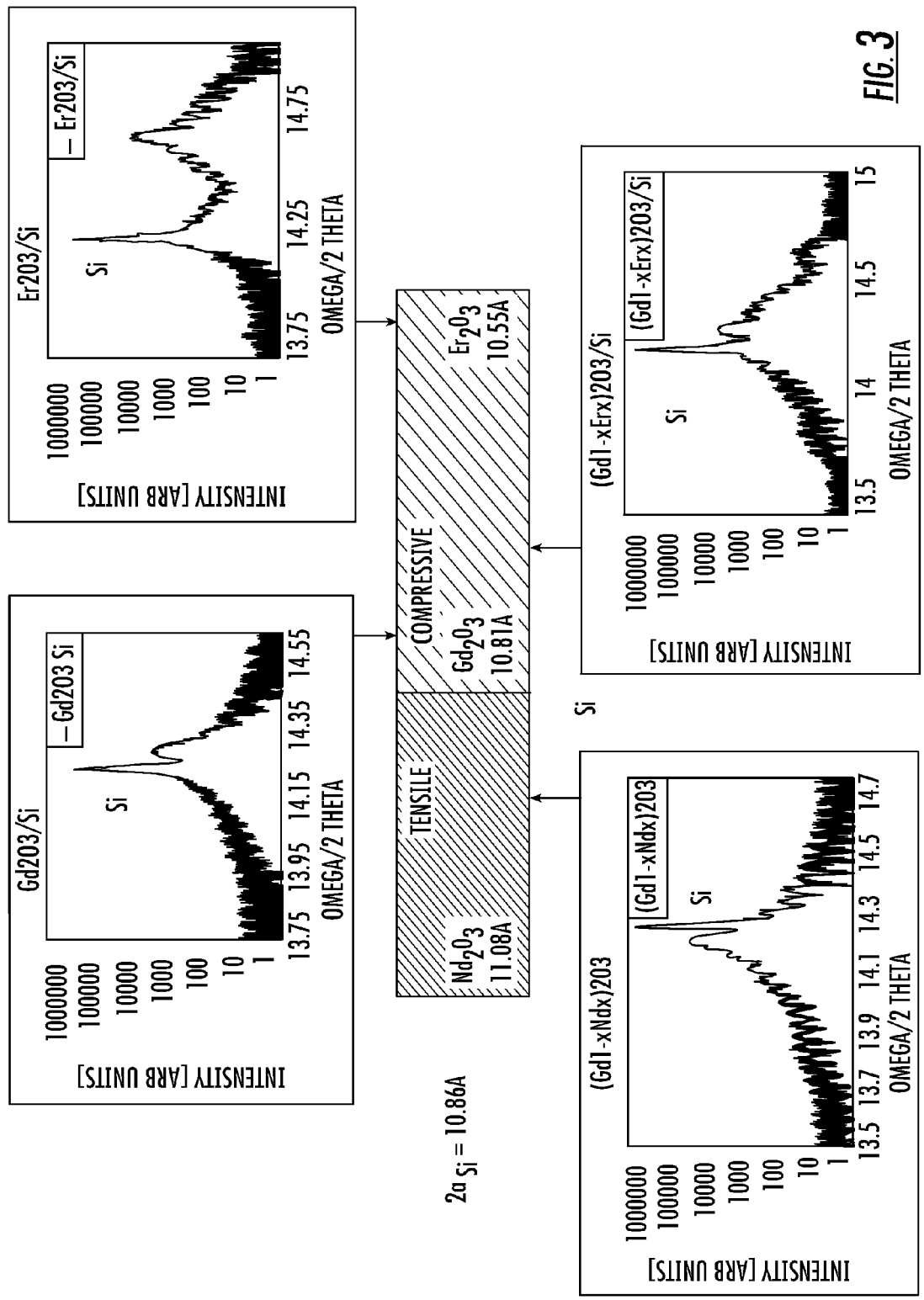
FIG. 3 illustrates the stress developed by several rare earth oxides relative to silicon.

In this specific example, structure 14 varies or changes from $M_1$ oxide to $M_n$ oxide, with 'n' representing 2, 3, etc. Generally, M, the rare earth in each layer (step or gradation), may change or may be a mix or alloy of different rare earths to change the lattice spacing the desired amount. For example, $Gd_2O_3$ has a lattice spacing of 10.81 Å compared to $2a_{Si}$ with a lattice spacing of 10.86 Å, or approximately two times the lattice spacing of silicon. $Er_2O_3$ has a lattice spacing of 10.55 Å ($Gd_{1-x}Er_x)_2O_3$ has a lattice spacing between 10.55 Å and 10.81 Å, depending upon the ratio of Gd and Er in the material, and $(Gd_{1-x}Nd_x)_2O_3$ has a lattice spacing between 11.08 Å (the lattice spacing of Nd) and 10.81 Å, depending upon the ratio of Gd and Nd in the material. Further, as illustrated in FIG. 3, the stress curves of several different rare earth oxides depict tensile stress for rare earth oxides with lattice spacing greater than $2a_{Si}$ and compressive stress for rare earth oxides with a lattice spacing less than $2a_{Si}$. Thus, it can be seen that through stress engineering of structure 14 any desired amount of stress, tensile or compressive, can be provided in the rare earth oxy-nitride layer 16 while still retaining a single crystal or crystalline material.

In a preferred embodiment, the rare earth used in the final layer of structure 14 (i.e. $M_n$ oxide) is the same rare earth used in layer 16 of $M_n$ oxy-nitride to provide the desired lattice matching. However, in some applications it may be desirable to use a rare earth in layer 16 that more closely lattice matches the lattice and lattice spacing of a III oxy-nitride structure 18 grown on layer 16. As described above in relation to structure 14, structure 18 may be considered a plurality of single crystal or crystalline layers or a single layer of single crystal or crystalline material with a plurality of sub-layers, either of which will be referred to herein for convenience of understanding as a "plurality of layers". In this embodiment, structure 18 includes a plurality of layers changing from $III_1$ oxy-nitride to $III_n$ oxy-nitride. Further, III oxy-nitride structure 18 may vary from the bottom to the top and/or within each layer (as described in more detail below) either linearly or in a step by step process.

In III oxy-nitride structure 18, the III material is any of the materials or combinations of the materials in the group III metals of the periodic table, including aluminum (Al), gallium (Ga), etc. Further, an oxy-nitride is defined as a mix of oxygen and nitrogen according to the formulas $O_xN_{(1-x)}$ where $0<X<1$. Preferably, the III material in structure 18 remains the same but x varies between zero and 1 as the structure is grown from layer 16 to a final layer 20 of single crystal or crystalline III nitride. It should be noted that layer 20 can be conveniently grown by a continuation of the same process that produces structure 18 by simply allowing x to go to zero. However, the III material can vary from the lower layer of structure 18 (i.e. the $III_1$ oxy-nitride) abutting layer 16 to the upper layer (i.e. the $III_n$ oxy-nitride) abutting layer 20. In a preferred embodiment, the III material in the final layer of structure 18 (i.e. the $III_n$ oxy-nitride) is the same as the III material in III nitride layer 20.

One major purpose of the varying structure 18 is to provide an interface or chemical engineering between M, oxy-nitride layer 16 and layer 20 of III nitride. That is, through chemical engineering the crystal lattice of $M_n$ oxy-nitride layer 16 is gradually matched to the crystal lattice of III nitride layer 20 while retaining the stress specifically engineered into $M_n$ oxy-nitride layer 16. The stress is specifically engineered to prevent or overcome any bowing or other deformities or cracking in III nitride layer 20. Thus, a layer of single crystal III nitride 20 can be conveniently grown with a much larger diameter and with virtually any desired thickness. Because of the larger diameter wafers that can be grown, a much higher yield can be realized.

Figure 2:
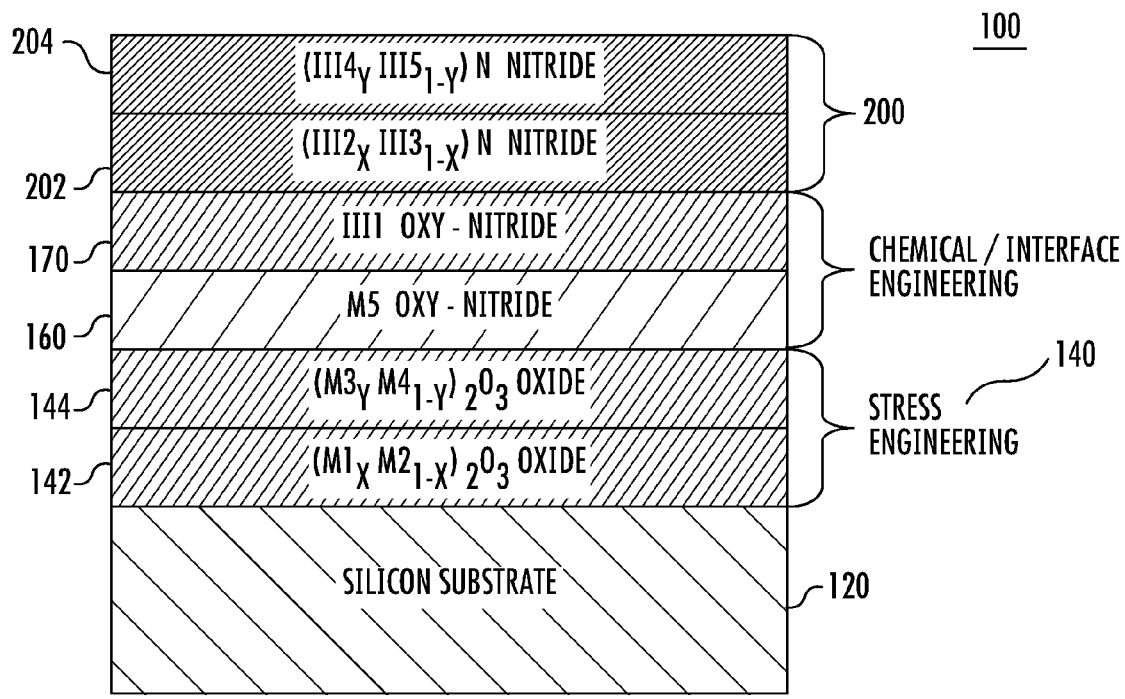
FIG. 2 is a more specific layer diagram of a stress engineered epitaxial wafer similar to the wafer described in FIG. 1.

Turning now to FIG. 2, a more specific embodiment of a stress engineered epitaxial wafer 100 in accordance with the present invention is illustrated. Wafer 100 includes a single crystal silicon substrate 120 which, it will be understood, is or may be a standard well know single crystal silicon wafer or portion thereof generally known and used in the semiconductor industry. Single crystal silicon substrate 120, it will be understood, is not limited to any specific crystal orientation but could include <111> silicon, <110> silicon, <100> silicon or any other orientation or variation known and used in the art.

A rare earth oxide structure 140 is grown directly on the surface of substrate 120 using any of the well known growth methods, such as MBE, MOCVD, PLD (pulsed laser deposition), sputtering, ALD (atomic layer deposition), or any other known growth method for thin films. Further, the growth method used will generally be used for all additional layers and may conveniently be employed to grow the entire structure in a continuous process sometimes referred to herein as performed within a one wafer single epitaxial process. Rare earth oxide structure 140 may be considered a plurality of single crystal or crystalline layers or a single layer of single crystal or crystalline material with a plurality of sub-layers, either of which will be referred to herein for convenience of understanding as a "plurality of layers". In any case, rare earth oxide structure 140 is positioned between the surface of substrate 120 and the lower surface of a single crystal layer of rare earth oxy-nitride 160. Throughout this disclosure whenever rare earth materials are mentioned it will be understood that "rare earth" materials are generally defined as any of the lanthanides as well as scandium and yttrium.

Rare earth oxide structure 140 is specifically designed or engineered to gradually adjust from the crystal lattice of substrate 120 to the crystal lattice of rare earth oxy-nitride layer 160, also designated $M_5$ oxy-nitride. This gradual adjustment of the crystal lattice between the interface with substrate 120 and the interface with layer 160 may be designed to closely match the lattice spacing between adjacent layers or to provide a predetermined amount of stress or mismatch in the lattice spacing. For example, layer 160 can be unstressed or stressed, either compressive or tensile, depending on the selection or engineering of the rare earth composition in structure 140. That is structure 140 is selected or engineered such that it constrains the overgrown rare earth oxy-nitride layer 160 to a predetermined stress state, either unstressed, or compressive, or tensile. The gradual adjustment of the crystal lattice performed in the growth of structure 140 is defined herein as stress engineering.

In this specific example, structure 140 includes two layers 142 and 144 each of which contains a mix of rare earths that vary either linearly or step wise from a lower interface to an upper interface. Layer 142 is illustrated with a formula $(M1_xM2_{(1-x)})_2O_3$ and layer 144 is illustrated with a formula $(M3_yM4_{(1-y)})_2O_3$. M1, M2, M3, and M4 are rare earth metals as defined above. Further, within layer 142 M1 and M2 vary with x being defined as 0≤x≤1. Also, within layer 144 M3 and M4 vary with y being defined as 0≤y≤1. Rare earth oxide layers 142 and 144 may vary from the bottom to the top either linearly or in a step by step process.

Generally, M, the rare earth in each layer (step or gradation), may change or may be a mix or alloy of different rare earths to change the lattice spacing the desired amount, depending upon the values of x and y. For example, $Gd_2O_3$ has a lattice spacing of 10.81 Å compared to $2a_{Si}$ with a lattice spacing of 10.86 Å, or approximately two times the lattice spacing of silicon. $Er_2O_3$ has a lattice spacing of 10.55 Å, $(Gd_{1-x}Er_x)_2O_3$ has a lattice spacing between 10.55 Å and 10.81 Å, depending upon the ratio of Gd and Er in the material, and $(Gd_{1-x}Nd_x)_2O_3$ has a lattice spacing between 11.08 Å (the lattice spacing of Nd) and 10.81 Å, depending upon the ratio of Gd and Nd in the material. Further, as illustrated in FIG. 3, the stress curves of several different rare earth oxides depict tensile stress for rare earth oxides with lattice spacing greater than $2a_{Si}$ and compressive stress for rare earth oxides with a lattice spacing less than $2a_{Si}$. Thus, it can be seen that through stress engineering of structure 140 any desired amount of stress, tensile or compressive, can be provided in the rare earth oxy-nitride layer 160 while still retaining a single crystal or crystalline material.

In the embodiment illustrated in FIG. 2, a single layer 170 of III1 oxy-nitride is illustrated which in conjunction with layer 160 of $M_5$ oxy-nitride are chemically engineered to lattice match with a III nitride structure 200 while transferring any stress engineered into layer 160 into III nitride structure 200. It will be understood that III1 oxy-nitride layer 170 can include a plurality of layers or sub-layers (similar to structure 18 described above) that gradually change the chemical interface from the rare earth oxy-nitride to III nitride structure 200.

In this specific embodiment III nitride structure 200 includes two layers 202 and 204 which are designated with the formulas $(III2_xIII3_{(1-x)})N$ and $(III4_yIII5_{(1-y)})N$, respectively. III2, III3, III4, and III5 are metals selected from the group III metals in the periodic table. Further, within layer 202 III2 and III3 vary with x being defined as 0≤x≤1 and within layer 204 III4 and III5 vary with y being defined as 0≤y≤1. Also, the ratios of III2/III3 and III4/III5 in layers 202 and 204, respectively, can vary either linearly or step wise.

Thus, new and improved structure and methods of growing III-N nitrides on silicon substrates have been disclosed. The new and improved methods provide large diameter, high yield epitaxial wafers of III-N nitrides on silicon. The new and improved methods result in a stress and chemical engineered epitaxial wafer having a III N nitride layer with a larger diameter and, therefore, a higher yield of final product. The stress is specifically engineered to prevent or overcome any bowing or other deformities or cracking in III nitride layer 20. Also, the high yield epitaxial wafers of III-N nitrides on silicon can be grown within a one wafer single epitaxial process.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. Rare earth oxy-nitride buffered III-N on silicon comprising:
   a crystalline silicon substrate with a 111 crystal orientation and having a crystal lattice spacing of $a_{Si}$;
   a rare earth oxide structure deposited on the silicon substrate and including a plurality of layers of single crystal rare earth oxide in contact with each other, and the rare earth oxide structure having a crystal lattice spacing adjacent the crystalline silicon substrate approximately equal to $2a_{Si}$;
   a layer of single crystal rare earth oxy-nitride deposited on the rare earth oxide structure, the rare earth oxide structure having a crystal lattice spacing adjacent the layer of single crystal rare earth oxy-nitride that is one of greater than $2a_{Si}$ and less than $2a_{Si}$ so as to provide a predetermined amount of stress in the layer of single crystal rare earth oxy-nitride, and the rare earth oxide structure being stress engineered to adjust the crystal lattice spacing from $2a_{Si}$ to the one of greater than $2a_{Si}$ and less than $2a_{Si}$;
   a III oxy-nitride structure deposited on the layer of single crystal rare earth oxy-nitride and including a plurality of layers of single crystal III oxy-nitride; and
   a layer of single crystal III nitride deposited on the III oxy-nitride structure, the III oxy-nitride structure being chemically engineered to transfer the predetermined amount of stress in the layer of single crystal rare earth oxy-nitride to the layer of single crystal III nitride, whereby bowing and cracking in the layer of single crystal III nitride are prevented.

2. Rare earth oxy-nitride buffered III-N on silicon as claimed in claim 1 wherein the rare earth in the rare earth oxide structure and the rare earth in the single crystal rare earth oxy-nitride layer each includes at least one of the lanthanides, scandium and yttrium.

3. Rare earth oxy-nitride buffered III-N on silicon as claimed in claim 1 wherein the stress engineering in the rare earth oxide structure includes gradually adjusting the crystal lattice spacing of the rare earth oxide structure from the crystal lattice spacing adjacent the substrate to the crystal lattice spacing adjacent the single crystal rare earth oxy-nitride layer.

4. Rare earth oxy-nitride buffered III-N on silicon as claimed in claim 3 wherein the gradual adjustment includes one of changing the rare earth in each consecutive layer or by using a gradually changing mix or alloy of different rare earths to change the lattice spacing by a desired amount.

5. Rare earth oxy-nitride buffered III-N on silicon as claimed in claim 4 wherein the rare earth included in the layer of single crystal rare earth oxy-nitride is the same as the rare earth in an adjacent layer of the plurality of layers of single crystal rare earth oxide.

6. Rare earth oxy-nitride buffered III-N on silicon as claimed in claim 1 wherein the III material in the III oxy-nitride structure includes a material or combination of the materials in the group III metals of the periodic table.

7. Rare earth oxy-nitride buffered III-N on silicon as claimed in claim 1 wherein the oxy-nitride in each of the plurality of layers of single crystal III oxy-nitride is defined by the formula $O_xN_{(1-x)}$ where $0<X<1$.

8. Rare earth oxy-nitride buffered III-N on silicon as claimed in claim 7 wherein the chemical engineering includes altering x to alter the chemical formula of each layer of the plurality of layers of single crystal III oxy-nitride.

9. Rare earth oxy-nitride buffered III-N on silicon as claimed in claim 1 wherein the rare earth oxide structure, the single crystal rare earth oxy-nitride layer, the III oxy-nitride structure, and the single crystal III nitride layer are each grown by one of MBE (Molecular Beam Epitaxy), MOCVD (Metalorganic Chemical Vapor Deposition), PLD (pulsed laser deposition), sputtering, and ALD (atomic layer deposition).

10. Rare earth oxy-nitride buffered III-N on silicon as claimed in claim 9 wherein the rare earth oxide structure, the single crystal rare earth oxy-nitride layer, the III oxy-nitride structure, and the single crystal III nitride layer are all grown by one of MBE, MOCVD, PLD, sputtering, and ALD in a one substrate single epitaxial process.

11. Rare earth oxy-nitride buffered III-N on silicon as claimed in claim 1 wherein at least one of the layers of the plurality of layers of single crystal rare earth oxide include one of $(Gd_{1-x}Er_x)_2O_3$ and $(Gd_{1-x}Nd_x)_2O_3$, where x is variable from 0 to 1.

12. Rare earth oxy-nitride buffered III-N on silicon comprising:
    a crystalline silicon substrate with a 111 crystal orientation and having a crystal lattice spacing of $a_{si}$;
    a rare earth oxide structure deposited on the crystalline silicon substrate and including a plurality of layers of single crystal rare earth oxide in contact with each other, at least one of the layers of the plurality of layers of single crystal rare earth oxide including a material with a formula $(M1_xM2_{(1-x)})_2O_3$, where M1 includes one of Er and Nd, M2 includes Gd, and x is variable from 0 to 1, and the rare earth oxide structure having a crystal lattice spacing adjacent the crystalline silicon substrate approximately equal to $2a_{si}$;
    a layer of single crystal rare earth oxy-nitride deposited on the rare earth oxide structure, the rare earth oxide structure having a crystal lattice spacing adjacent the layer of single crystal rare earth oxy-nitride that is one of greater than $2a_{Si}$ and less than $2a_{Si}$ so as to provide a predetermined amount of stress in the layer of single crystal rare earth oxy-nitride;
    a III oxy-nitride structure deposited on the layer of single crystal rare earth oxy-nitride and including a plurality of layers of single crystal III oxy-nitride, the III oxy-nitride structure including one of aluminum (Al) and gallium (Ga) and is further defined as a mix of oxygen and nitrogen according to the formulas $O_xN_{(1-x)}$ where $0<X<1$; and
    a layer of single crystal III nitride including one of aluminum (Al) and gallium (Ga) and deposited on the III oxy-nitride structure, the III oxy-nitride structure being chemically engineered to transfer the predetermined amount of stress in the layer of single crystal rare earth oxy-nitride to the layer of single crystal III nitride whereby bowing and cracking in the layer of single crystal III nitride is prevented.

\* \* \* \* \*